United States Patent
Dolin

(10) Patent No.: US 8,648,661 B1
(45) Date of Patent: Feb. 11, 2014

(54) CURRENT LIMITING CIRCUIT

(71) Applicant: Anadigics, Inc., Warren, NJ (US)

(72) Inventor: Adam Dolin, Springfield, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 13/676,521

(22) Filed: Nov. 14, 2012

Related U.S. Application Data

(60) Provisional application No. 61/561,714, filed on Nov. 18, 2011.

(51) Int. Cl.
*H03G 3/10* (2006.01)
(52) U.S. Cl.
USPC .......................................... 330/284; 330/279
(58) Field of Classification Search
USPC .................. 330/284, 279, 285, 296, 288, 282
See application file for complete search history.

(56) References Cited

U.S. PATENT DOCUMENTS

| | | | | |
|---|---|---|---|---|
| 4,234,853 | A * | 11/1980 | Yamaguchi | 330/280 |
| 5,699,017 | A * | 12/1997 | Maejima | 330/280 |
| 5,936,470 | A * | 8/1999 | Stroud | 330/284 |
| 6,281,757 | B1 * | 8/2001 | Tomiyama | 330/310 |
| 7,504,885 | B2 * | 3/2009 | Oba et al. | 330/284 |

* cited by examiner

*Primary Examiner* — Henry Choe
(74) *Attorney, Agent, or Firm* — William L. Botjer

(57) ABSTRACT

A current limiting circuit includes a power amplifier receiving an input signal through an attenuator. The power amplifier comprises one or more amplification stages and an output stage. The output stage is connected to an antenna. A mirror circuit is connected in parallel to the output stage. The magnitude of a first current flowing through the mirror circuit is proportional to the magnitude of a second current flowing through the output stage. Further, the current limiting circuit includes a comparator that compares the magnitude of the first current with a reference value to generate a control signal. The attenuator adjusts the power of the input signal based on the control signal thereby limiting the magnitude of the second current.

18 Claims, 3 Drawing Sheets

CURRENT LIMITING CIRCUIT

CROSS REFERENCE TO RELATED APPLICATION

This application claims priority from the U.S. provisional application No. 61/561,714, titled "Current Limiting Circuit", filed on Nov. 18, 2011, the disclosure of which is hereby incorporated by reference.

TECHNICAL FIELD

The presently disclosed embodiments are related, in general, to a electronic transmission system. More particularly, the presently disclosed embodiments are related to a current limiting circuit in the electronic radio frequency transmission system.

BACKGROUND OF THE INVENTION

Electronic devices use an antenna system to transmit data and messages to other electronic devices in accordance with wireless protocols. Typically, the antenna system includes a power amplifier and an antenna element. The antenna element is usually arranged to transmit signal containing the data. Prior to transmission of the signal, the power amplifier amplifies the signal.

In a typical scenario, the power amplifier is designed taking into account the loading of antenna element. Usually, the power amplifier is designed for a load of 50Ω. However, the load on the antenna element depends on various factors such as the orientation of the antenna element and the external environment surrounding the antenna element. Due to such variations in the load of the antenna element, the antenna element may draw a large amount of current from the power amplifier, which may damage the power amplifier.

In the present state of technology, in order to limit the flow of large amounts of current through the power amplifiers, power amplifiers with variable gain have been designed. In such power amplifiers, the bias voltage applied to the power amplifier is varied in order to vary the gain of the power amplifiers. Since, current flowing through the power amplifier is directly proportional to the gain of the power amplifier, current flowing through the power amplifier is limited. However, varying the bias voltage may change various characteristics associated with the power amplifier, such as: dynamic range, input impedance, and output impedance. These variations in the characteristics of the power amplifier may, in turn, lead to distortion in the output signal generated by the power amplifier.

Thus, there is a need for an improved technique to limit the amount of current flowing through the power amplifier without distorting the output signal.

SUMMARY OF THE INVENTION

According to embodiments illustrated herein, there the present invention is directed to a current limiting circuit. The current limiting circuit includes a power amplifier receiving an input signal through an attenuator. The power amplifier comprises one or more amplification stages and an output stage. The output stage is connected to an antenna. Further, the current limiting circuit includes a mirror circuit connected in parallel to the output stage. The magnitude of a first current flowing through the mirror circuit is proportional to the magnitude of a second current flowing through the output stage. Additionally, the current limiting circuit includes a comparator that compares the magnitude of the first current with a reference value to generate a control signal. The attenuator adjusts the power of the input signal based on the control signal thereby limiting the magnitude of the second current.

In an embodiment, the output stage of the power amplifier includes a first transistor and the mirror circuit includes a second transistor. The emitter area of the second transistor is smaller in comparison to emitter area of the first transistor by a predefined factor. Hence, the current in the second transistor is less in comparison to the current in the first transistor by the predefined factor.

Since, the power of the input signal is varied in order to limit the amount of current flowing through the power amplifier; the output signal is free from distortion.

BRIEF DESCRIPTION OF DRAWINGS

The following detailed description of the embodiments of the present invention will be better understood when read in conjunction with the appended drawings. The present invention is illustrated by way of example, and not limited by the accompanying figures, in which like references indicate similar elements.

DETAILED DESCRIPTION OF THE PREFERRED EMBODIMENTS

The invention can be best understood with reference to the detailed figures and description set forth herein. Various embodiments are discussed below with reference to the figures. However, those of ordinary skill in the art will readily appreciate that the detailed description given herein with respect to these figures is simply for explanatory purposes. The disclosed systems or circuits extend beyond the described embodiments. For example, those of ordinary skill in the art will appreciate that in light of the teachings presented, multiple alternate and suitable approaches may be realized, to implement the functionality of any detail described herein, beyond the particular implementation choices in the following embodiments described and shown.

Figure 1:
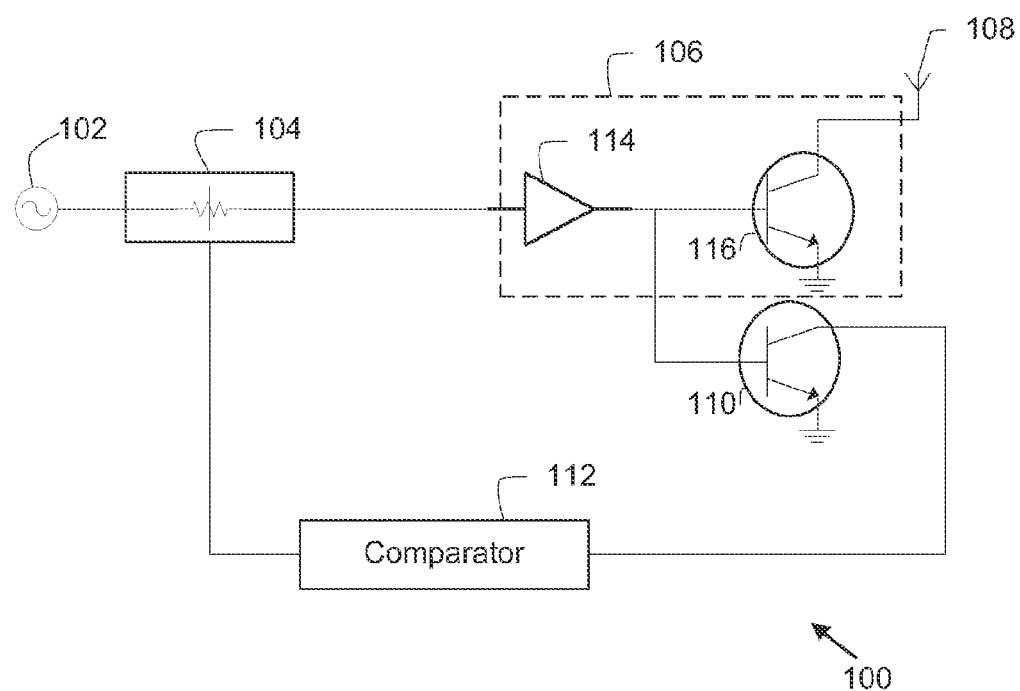
FIG. 1 is a schematic diagram depicting a current limiting circuit in accordance with an embodiment of the invention.

FIG. 1 is a schematic diagram depicting a current limiting circuit 100 in accordance with an embodiment of the invention. Current limiting circuit 100 includes a signal source 102, an attenuator 104, a power amplifier 106, an antenna 108, a second transistor 110, and a comparator 112. Power amplifier 106 further includes one or more amplification stages 114 and a first transistor 116. In an embodiment, first transistor 116 is an output stage of power amplifier 106.

Attenuator 104 receives an input signal from signal source 102. Attenuator 104 is connected to input of one or more amplification stages 114. The output of one or more amplification stages 114 is connected to a base terminal of first transistor 116. A collector terminal of first transistor 116 is connected to antenna 108 through an impedance matching network (not shown). An emitter terminal of first transistor 116 is grounded. Further, the base terminal of first transistor 116 is connected to a base terminal of second transistor 110. An emitter terminal of second transistor 110 is grounded. A collector terminal of second transistor 110 is connected to comparator 112. Comparator 112 is connected to attenuator 104.

In an alternate embodiment, attenuator 104 is connected in between one or more amplification stages 114 of power amplifier 106. A person having ordinary skill in the art would understand that the position of attenuator 104 could be changed according to the gain requirements of power amplifier 106.

In an embodiment, the emitter area of second transistor 110 is less than the emitter area of first transistor 116 by a predefined factor. The following equation illustrates a relation between the emitter area of second transistor 110 and the emitter area of first transistor 116:

$$AE_1 = AE_2/\alpha \quad (1)$$

Where,
$AE_1$: Emitter area of first transistor 116;
$AE_2$: Emitter area of second transistor 110; and
$\alpha$: Predefined factor.

In an exemplary embodiment, the emitter area of first transistor 116 and second transistor 110 is determined at the time of fabrication. As an non limiting example, the emitter area of first transistor 116 and second transistor 110 is determined based on the application in which first transistor 116 and second transistor 110 are to be used. For example, the emitter area of first transistor 116 is 50 $\mu m^2$ and the emitter area of second transistor 110 is 25 $\mu m^2$. Therefore, the value of the predetermined factor ($\alpha$) is 0.5.

In operation, one or more amplification stages 114 receive an input signal from signal source 102 through attenuator 104. One or more amplification stages 114 amplify the input signal to generate an amplified input signal. The amplified input signal is transmitted to antenna 108 through first transistor 116. In an embodiment, antenna 108 further transmits the amplified input signal in accordance with various wireless protocols, such as, but not limited to, 2G, 3G, or 4 G communication protocols. To transmit the amplified input signal, antenna 108 draws a first current from first transistor 116. Hereinafter, the amplified input signal can be been alternatively referred to as the output signal.

Second transistor 110 draws a second current from power amplifier 106. A person having ordinary skill in the art would understand that as the base terminal of second transistor 110 is connected to the base terminal of first transistor 116, second transistor 110 acts as a mirror device for first transistor 116. Henceforth, the second current flowing through second transistor 110 will mirror the first current flowing through first transistor 116.

Since the emitter area of second transistor 110 is less than the emitter area of first transistor 116 by a predefined factor, magnitude of the second current is less than the magnitude of the first current by the predefined factor. The following equation illustrates the relation between the first current and the second current:

$$I_2 = I_1/\alpha \quad (2)$$

Where,
$I_2$: Magnitude of the first current;
$I_1$: Magnitude of the second current; and
$\alpha$: Predefined factor.

Comparator 112 compares the magnitude of the second current with a reference value. Based on the comparison, comparator 112 generates a control signal. The control signal is utilized for controlling the operation of attenuator 104. Attenuator 104 varies a power of the input signal based on the control signal. The operation of comparator 112 and the generation of control signal is described below in conjunction with FIG. 2 and FIG. 3.

Figure 2:
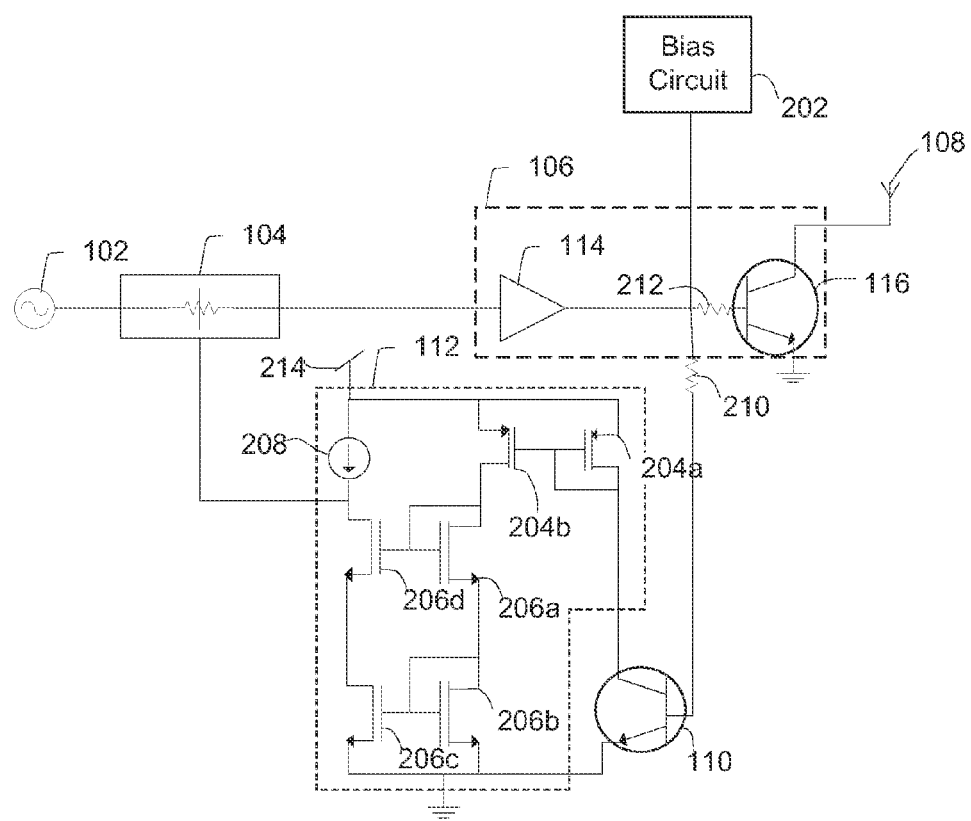
FIG. 2 is a schematic diagram depicting a current limiting circuit in accordance with an embodiment of the invention.

FIG. 2 is a schematic diagram depicting a current limiting circuit 200 in accordance with an embodiment of the invention. Current limiting circuit 200 includes various elements which are a part of current limiting circuit 100 (refer to FIG. 1) and using the same reference numbers, except for a bias circuit 202, a first P-MOS transistor 204a, a second P-MOS transistor 204b, a first N-MOS transistor 206a, a second N-MOS transistor 206b, a third N-MOS transistor 206c, a fourth N-MOS transistor 206d, a current source 208, a first resistive element 210, a second resistive element 212, and a voltage source 214.

The elements referenced with same numbers in FIG. 2 as that of current limiting circuit 100 are connected in similar fashion as explained in FIG. 1. Bias circuit 202 is connected to the base terminal of first transistor 116 and second transistor 110 through first resistive element 210 and second resistive element 212, respectively. The collector terminal of second transistor 110 is connected to a drain terminal of first P-MOS transistor 204a. A gate terminal of first P-MOS transistor 204a is connected to the drain terminal of the first P-MOS transistor 204a. A source terminal of the first P-MOS transistor 204a is connected to voltage source 214. A source terminal of second P-MOS transistor 204b is connected to voltage source 214. A gate terminal of second P-MOS transistor 204b is connected the gate terminal of first P-MOS transistor 204a. A drain terminal of second P-MOS transistor 204b is connected to a drain terminal of first N-MOS transistor 206a. A gate terminal of first N-MOS transistor 206a is connected to the drain terminal of first N-MOS transistor 206a. A source terminal of first N-MOS transistor 206a is connected to a drain terminal of second N-MOS transistor 206b. A gate terminal of second N-MOS transistor 206b is connected to the drain terminal of second N-MOS transistor 206b. A source terminal of second N-MOS transistor 206b is grounded. A source terminal of third N-MOS transistor 206c is grounded. A gate terminal of third N-MOS transistor 206c is connected to the gate terminal of second N-MOS transistor 206b. A drain terminal of second N-MOS transistor 206c is connected to a source terminal of fourth N-MOS transistor 206d. A gate terminal of fourth N-MOS transistor 206d is connected to the gate terminal of first N-MOS transistor 206a. A drain terminal of fourth N-MOS transistor 206d is connected to voltage source 214 through current source 208. Further, the drain terminal of fourth transistor 206d is connected to attenuator 104. In an embodiment, voltage at the drain terminal of fourth transistor 206d corresponds to the control signal applied to attenuator 104.

First P-MOS transistor 204a, second P-MOS transistor 204b, first N-MOS transistor 206a, second N-MOS transistor 206b, third N-MOS transistor 206c, fourth N-MOS transistor 206d, current source 208, and voltage source 214, thus connected, forms comparator 112.

As described above in conjunction with FIG. 1, the second current flows through second transistor 110. The second current is transmitted to first P-MOS transistor 204a. As first P-MOS transistor 204a and second P-MOS transistor 204b are connected in a current mirror configuration, the second current flowing through first P-MOS transistor 204a is mirrored in second P-MOS transistor 204b.

The mirrored second current is transmitted to first N-MOS transistor 206a. First N-MOS transistor 206a and fourth N-MOS transistor 206d are connected in current mirror configuration. Further, second N-MOS transistor 206b and third N-MOS transistor 206c are also connected in current mirror configuration. Hence, third N-MOS transistor 206c and fourth N-MOS transistor 206d draws a third current from current source 208 having the same magnitude as the magnitude of second current (i.e. $I_1/\alpha$). In an embodiment, the maximum current that can be drawn from current source 208 is equal to the reference value. A person having ordinary skill in the art will understand that the reference value is determined based on the application in which current limiting circuit 100 is being used. Examples of some of the application areas may include, but not limited to, Mobile phones, base stations, network interface cards, etc.

In a scenario when the magnitude of the second current is less than the reference value, the magnitude of the third current drawn from current source 208 by third N-MOS transistor 206c and fourth transistor 206d is same as the magnitude of second current. Further, in such a scenario, the impedance offered by current source 208 is zero. Hence, the voltage at drain terminal of fourth N-MOS transistor 206d is equal to the magnitude of the voltage supplied by voltage source 214. Voltage at the drain terminal of the fourth transistor 206d is applied to attenuator 104 as control signal.

In an embodiment, the amount by which attenuator 104 attenuates the power of the input signal is inversely proportional to the magnitude of the control signal. Since the magnitude of control signal in above described scenario is equal to the magnitude of voltage source 214, attenuator 104 minimally attenuates the power of the input signal.

In another scenario when the magnitude of the second current is more than the reference value, current source 208 is unable to supply the third current with the same magnitude as that of the second current. Further, in such a scenario, the impedance offered by current source 208 is very high (ideally infinite). Hence, voltage at drain terminal of fourth N-MOS transistor 206d is equal to the ground voltage. The ground voltage is applied to attenuator 104 as a control signal.

In the above described scenario, since the magnitude of the control signal is equal to the ground voltage, attenuator 104 attenuates the power of the input signal. The attenuation of the power of input signal leads to attenuation of the power of the output signal. Attenuation of the power of the output signal leads to a drop in the magnitude of the first current drawn by antenna 108. Attenuator 104 attenuates the power of the input signal until the magnitude of the second current (i.e., $I_1/\alpha$) is less than the reference value (i.e., maximum current that can be drawn from current source 208).

Figure 3:
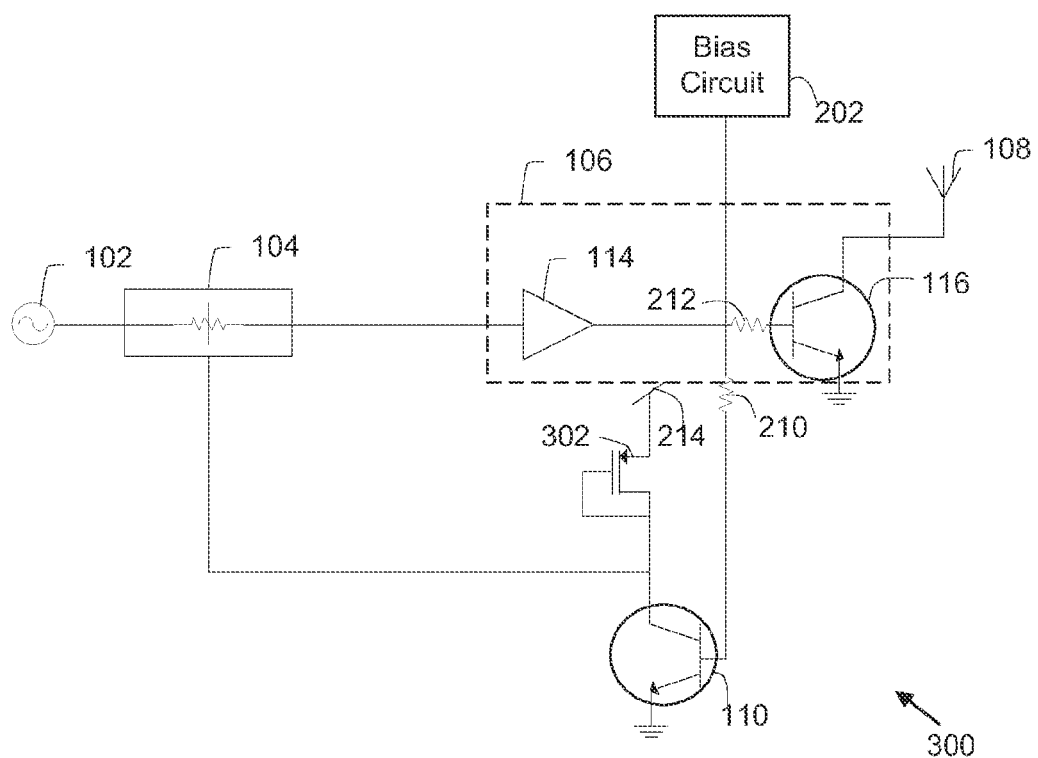
FIG. 3 is a schematic diagram depicting another current limiting circuit in accordance with an embodiment of the invention.

FIG. 3 is another schematic diagram depicting another current limiting circuit 300 in accordance with an embodiment of the invention. Current limiting circuit 300 includes various elements illustrated as a part of current limiting circuit 100 (refer to FIG. 1) and using the same reference numbers except for a third transistor 302. Further, current limiting circuit 300 includes various elements illustrated as a part of current limiting circuit 200 (refer to FIG. 2) and using the same reference numbers. In an embodiment, third transistor 302 is a depletion type transistor.

The elements referenced with same numbers in FIG. 3 as that of current limiting circuit 100 and current limiting circuit 200 are connected in similar fashion as explained in FIG. 1 and FIG. 2, respectively. A source terminal of third transistor 302 is connected to the collector terminal of second transistor 110. The source terminal is further connected to attenuator 104. A gate terminal of third transistor 302 is connected to the source terminal of third transistor 302. A drain terminal of third transistor 302 is connected to voltage source 214.

In an embodiment, voltage at the source terminal of the third transistor 302 corresponds to the control signal.

A person having ordinary skill in the art will understand that since third transistor 302 is a depletion type transistor, third transistor 302 has a predefined current limiting on the maximum amount of current that can flow through third transistor 302. In an embodiment, the predefined current limiting corresponds to the reference value.

In a scenario when the magnitude of the second current is less than the reference value, third transistor 302 operates in an ON state. Further, impedance of a third transistor 302 is zero. Hence, voltage at source terminal of third transistor 302 is equal to the magnitude of the voltage supplied by voltage source 214. Further, the voltage at the source terminal of third transistor 302 is applied to attenuator 104 as control signal.

Since the magnitude of control signal is equal to the magnitude of the voltage supplied by voltage source 214, attenuator 104 minimally attenuates the power of the input signal.

In another scenario when the magnitude of the second current is more than the reference value, third transistor 302 operates in an OFF state. Further, the impedance of third transistor 302 is infinity. Hence, voltage at source terminal of third transistor 302 is equal to the ground voltage. Further, the voltage at the source terminal of third transistor 302 is applied to attenuator 104 as control a signal.

In above described scenario, as magnitude of control signal is equal to the ground voltage, attenuator 104 attenuates the power of the input signal. Attenuation of the power of the input signal leads to a drop in the magnitude of the first current drawn by antenna 108 (as described in conjunction with FIG. 2). Attenuator 104 attenuates the power of the input signal until the magnitude of the second current (i.e., $I_1/\alpha$) is less than the reference value (i.e., the maximum current that can be drawn from current source 208).

The disclosed embodiments encompass numerous advantages. The gain of power amplifier 106 is not varied to limit the amount of current in the circuit. Instead, the power of the input signal is varied to limit the amount of current in the circuit. Hence, various characteristics associated with power amplifier, such as, but not limited to, dynamic range, input impedance, and output impedance of power amplifier, do not change. Thus, the overall response of the power amplifier remains constant throughout the operation. Therefore, the output signal generated by the power amplifier remains distortion free.

While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A current limiting circuit comprising:
an attenuator;
a power amplifier receiving an input signal through the attenuator, the power amplifier having one or more amplification stages and an output stage, the output stage being connected to an antenna through an impedance matching network;
a mirror circuit connected in parallel to the output stage, such that the magnitude of a first current flowing through the mirror circuit is proportional to the magnitude of a second current flowing through the output stage; and
a comparator that compares the magnitude of the first current with a reference value to generate a control signal, wherein the attenuator adjusts the power of the input signal based on the control signal to limit the magnitude of the second current.

2. The current limiting circuit as claimed in claim 1, wherein the output stage of the power amplifier comprises a first transistor, wherein a base terminal of the first transistor is connected to one of the one or more amplification stages, a collector terminal of the first transistor is connected to the antenna through an impedance matching network, and an emitter terminal of the first transistor is grounded.

3. The current limiting circuit as claimed in claim 2, wherein the mirror circuit comprises a second transistor, wherein a base terminal of the second transistor is connected to the base terminal of the first transistor, a collector terminal of the second transistor is connected to the comparator, and an emitter terminal of the second transistor is grounded.

4. The current limiting circuit as claimed in claim 3, wherein an emitter area of the second transistor is smaller in comparison to an emitter area of the first transistor by a predefined factor.

5. The current limiting circuit as claimed in claim 4, wherein the magnitude of the first current is less in comparison to the magnitude of the second current by the predefined factor.

6. The current limiting circuit as claimed in claim 1, wherein the one or more amplification stages comprise a first set of amplification stages and a second set of amplification stages, wherein an output of the first set of amplification stages is connected to the attenuator, and wherein an output of the attenuator is connected to an input of the second set of amplification stages.

7. The current limiting circuit as claimed in claim 1, wherein the comparator comprises:
  a first P-MOS transistor, wherein a drain terminal of the first P-MOS transistor is connected to the mirror circuit, a gate terminal of the first P-MOS transistor is connected to the drain terminal of the first P-MOS transistor, and a source terminal of the first P-MOS transistor is connected to a voltage source;
  a second P-MOS transistor, wherein a source terminal of the second P-MOS transistor is connected to the voltage source, a gate terminal of the second P-MOS transistor is connected the gate terminal of the first P-MOS transistor;
  a first N-MOS transistor, wherein a drain terminal of the first N-MOS transistor is connected to a drain terminal of the second P-MOS transistor, a gate terminal of the first N-MOS transistor is connected to the drain terminal of the first N-MOS transistor;
  a second N-MOS transistor, wherein a drain terminal of the second N-MOS transistor is connected to a source terminal of the first N-MOS transistor, a gate terminal of the second N-MOS transistor connected to the drain terminal of the second N-MOS transistor, a source terminal of the second N-MOS transistor is grounded;
  a third N-MOS transistor, wherein a source terminal of the third N-MOS transistor is grounded, a gate terminal of the third N-MOS transistor connected to the gate terminal of the second N-MOS transistor; and
  a fourth N-MOS transistor, wherein a source terminal of the fourth N-MOS transistor is connected to a drain terminal of the third N-MOS transistor, a gate terminal of the fourth N-MOS transistor connected to the gate terminal of the first N-MOS transistor, a drain terminal of the fourth N-MOS transistor is connected to the voltage source through a current source, wherein the current source generates a reference current, and wherein a magnitude of the reference current corresponds to the reference value.

8. The current limiting circuit as claimed in claim 7, wherein the drain terminal of the fourth N-MOS transistor is connected to the attenuator.

9. The current limiting circuit as claimed in claim 1, wherein the comparator comprises a third transistor, wherein a source terminal of the third transistor is connected to the mirror circuit, a gate terminal of the third transistor is connected to the source terminal of the third transistor, and a drain terminal of the third transistor is connected to a voltage source.

10. The current limiting circuit as claimed in claim 9, wherein the third transistor is a depletion mode transistor.

11. A current limiting circuit comprising:
  a power amplifier receiving an input signal through an attenuator, the power amplifier comprising one or more amplification stages and an output stage, the output stage being connected to an antenna through an impedance matching network;
  a mirror circuit connected in parallel to the output stage, such that the magnitude of a first current flowing through the mirror circuit is proportional to the magnitude of a second current flowing through the output stage; and
  a comparator including:
    a first P-MOS transistor, wherein a drain terminal of the first P-MOS transistor is connected to the mirror circuit, a gate terminal of the first P-MOS transistor is connected to the drain terminal of the first P-MOS transistor, and a source terminal of the first P-MOS transistor connected to a voltage source;
    a second P-MOS transistor, wherein a source terminal of the second P-MOS transistor is connected to the voltage source, a gate terminal of the second P-MOS transistor is connected the gate terminal of the first P-MOS transistor;
    a first N-MOS transistor, wherein a drain terminal of the first N-MOS transistor is connected to a drain terminal of the second P-MOS transistor, a gate terminal of the first N-MOS transistor connected to the drain terminal of the first N-MOS transistor;
    a second N-MOS transistor, wherein a drain terminal of the second N-MOS transistor is connected to a source terminal of the first N-MOS transistor, a gate terminal of the second N-MOS transistor connected to the drain terminal of the second N-MOS transistor, a source terminal of the second N-MOS transistor is grounded;
    a third N-MOS transistor, wherein a source terminal of the third N-MOS transistor is grounded, a gate terminal of the third N-MOS transistor connected to the gate terminal of the second N-MOS transistor; and
    a fourth N-MOS transistor, wherein a source terminal of the fourth N-MOS transistor is connected to a drain terminal of the third N-MOS transistor, a gate terminal of the fourth N-MOS transistor connected to the gate terminal of the first N-MOS transistor, a drain terminal of the fourth N-MOS transistor is connected to the attenuator and the voltage source through a current source, wherein the current source generates a reference current; and
  wherein the comparator compares the magnitude of the first current with a magnitude of the reference current to generate a control signal, wherein the attenuator adjusts a power of the input signal based on the control signal thereby limiting the magnitude of the second current.

12. The current limiting circuit as claimed in claim 11, wherein the magnitude of the control signal is the same as the magnitude of the voltage source when the magnitude of the reference current is more than the magnitude of the first current.

13. The current limiting circuit as claimed in claim 11, wherein the control signal is grounded when the magnitude of the reference current is less than the magnitude of the first current.

14. A current limiting circuit comprising:
an attenuator;
a power amplifier receiving an input signal through the attenuator, the power amplifier having one or more amplification stages, and an output stage, the output stage being connected to an antenna through an impedance matching network;
a mirror circuit connected in parallel to the output stage, such that the magnitude of a first current flowing through the mirror circuit is proportional to the magnitude of a second current flowing through the output stage; and
a comparator including:
 a third transistor, a source terminal of the third transistor being connected to the mirror circuit and the attenuator, a gate terminal of the third transistor is connected to the source terminal of the third transistor, a drain terminal of the third transistor is connected to a voltage source, the third transistor switching between an ON state and an OFF state based on the magnitude of the first current; and
wherein the comparator generates a control signal based on the ON state or the OFF state of the third transistor, the attenuator adjusting the power of the input signal based on the control signal to limit the magnitude of the second current.

15. The current limiting circuit as claimed in claim 14, the third transistor has a predefined current limiting on an amount of current flowing through the third transistor, wherein the predefined current limit corresponds to a reference value.

16. The current limiting circuit as claimed in claim 15, wherein the third transistor switches to the OFF state when the magnitude of the first current is more than the reference value, and wherein the control signal is grounded when the third transistor operates in the OFF state.

17. The current limiting circuit as claimed in claim 15, wherein the third transistor switches to the ON state when the magnitude of the first current is less than the reference value, and wherein the magnitude of the control signal is same as the magnitude of the voltage source when the third transistor operates in the ON state.

18. The current limiting circuit as claimed in claim 14, wherein the third transistor is a depletion mode transistor.

* * * * *